(12) United States Patent
Zeng

(10) Patent No.: US 11,094,906 B2
(45) Date of Patent: *Aug. 17, 2021

(54) DISPLAY PANEL

(71) Applicant: Shenzhen China Star Optoelectronics Semiconductor Display Technology Co., Ltd., Guangdong (CN)

(72) Inventor: Weijing Zeng, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 42 days.

This patent is subject to a terminal disclaimer.

(21) Appl. No.: 16/620,877

(22) PCT Filed: Nov. 12, 2019

(86) PCT No.: PCT/CN2019/117345
§ 371 (c)(1),
(2) Date: Dec. 10, 2019

(87) PCT Pub. No.: WO2021/027138
PCT Pub. Date: Feb. 18, 2021

(65) Prior Publication Data
US 2021/0050541 A1 Feb. 18, 2021

(30) Foreign Application Priority Data
Aug. 15, 2019 (CN) .......................... 201910755693.8

(51) Int. Cl.
*H01L 51/50* (2006.01)
*H01L 27/32* (2006.01)
*H01L 51/52* (2006.01)

(52) U.S. Cl.
CPC ........ *H01L 51/502* (2013.01); *H01L 27/3276* (2013.01); *H01L 51/5212* (2013.01); *H01L 2251/306* (2013.01); *H01L 2251/308* (2013.01)

(58) Field of Classification Search
CPC ............... H01L 51/502; H01L 27/3276; H01L 51/5212; H01L 2251/306; H01L 2251/308
See application file for complete search history.

(56) References Cited

U.S. PATENT DOCUMENTS

2004/0061136 A1 4/2004 Tyan et al.
2005/0122053 A1 6/2005 Ko

FOREIGN PATENT DOCUMENTS

CN 1498046 A 5/2004
CN 109721692 A 5/2019

*Primary Examiner* — Anthony Ho
(74) *Attorney, Agent, or Firm* — Mark M. Friedman

(57) ABSTRACT

A display panel is provided, which includes a light-emitting structure. The light-emitting structure includes an anode positioned on a thin film transistor layer, a luminescent material layer positioned on the anode, and a cathode covering the luminescent material layer. The light-emitting structure further includes a cathode reflective layer and a quantum dot film. The cathode reflective layer is positioned above the cathode and is electrically insulated from the cathode by a reflective isolation layer. The quantum dot film is positioned in the reflective isolation layer that is between the cathode and the cathode reflective layer.

11 Claims, 1 Drawing Sheet

DISPLAY PANEL

FIELD OF INVENTION

The present application relates to the field of electronic displays, and in particular, to a display panel.

BACKGROUND OF INVENTION

In order to improve the display effect of organic light-emitting diode (OLED) display panels, in the conventional art, a quantum dot film is usually added to the display panels. The quantum dot film has photoluminescence characteristics, and light emitted from the quantum dot film has high color purity and small color shift, and can effectively improve luminous performance of the OLED display panels.

Technical Problem

Limited by the fabrication process, the quantum dot films of conventional art are commonly used in top-emission OLED display panels. Typically, a quantum dot film is placed on the cover over a light-emitting structure. However, compared to bottom-emission OLED display panels, film thicknesses of the top-emission OLED display panels are difficult to adjust, a cathode voltage drop is serious, and the fabrication process is relatively complicated.

Therefore, in order to further optimize performance of the display panels and simplify fabrication process of the display panels, it is necessary to propose bottom-emission OLED display panels using a quantum dot film.

SUMMARY OF INVENTION

Technical Solution

The present application provides a display panel to solve the technical problem that a film thickness of a top-emission organic light-emitting diode (OLED) display panel in the conventional art is difficult to adjust, a cathode voltage drop is serious, and the fabrication process is relatively complicated.

In order to solve the above problems, the present application provides a display panel, the display panel including a substrate, a thin film transistor layer, and a light-emitting structure, the light-emitting structure including:

an anode positioned on the thin film transistor layer, and electrically connected to the thin film transistor layer;

a luminescent material layer positioned on the anode; and a cathode covered the luminescent material layer;

wherein the light-emitting structure further includes a cathode reflective layer and a quantum dot film, the cathode reflective layer is positioned above the cathode and electrically insulated from the cathode by a reflective isolation layer, the quantum dot film is positioned in the reflective isolation layer between the cathode and the cathode reflective layer.

According to one aspect of the present application, materials of the anode and the cathode are selected from a combination of one or more of indium tin oxide, aluminum-doped zinc oxide, and fluorine-doped tin oxide.

According to one aspect of the present application, material of the cathode reflective layer is selected from a combination of one or more of silver, copper, aluminum, gold, and iron.

According to one aspect of the present application, a surface of the cathode reflective layer is a smooth mirror structure.

According to one aspect of the present application, the cathode reflective layer is disposed corresponding to the luminescent material layer, and a projection of the cathode reflective layer on a light-emitting surface of the display panel is greater than a projection of the luminescent material the layer on the light-emitting surface of the display panel.

According to one aspect of the present application, the reflective isolation layer includes a positioned through hole, and the quantum dot film is positioned in the positioned through hole.

According to one aspect of the present application, the positioned through hole is disposed corresponding to the luminescent material layer, and a projection of the positioned through hole on the light-emitting surface of the display panel is greater than the projection of the luminescent material layer on the light-emitting surface of the display panel.

According to one aspect of the present application, the quantum dot film includes:

a quantum dot material layer;

a barrier layer attached to two surfaces of the quantum dot material layer parallel to the light-emitting surface of the display panel; and a protective layer attached to a surface of the barrier layer away from the quantum dot material layer.

According to one aspect of the present application, a surface of the protective layer away from the quantum dot material layer consists of an optical micro/nano structure.

According to one aspect of the present application, sizes of quantum dots in the quantum dot film correspond to a color of light emitted from the luminescent material layer;

wherein when the light emitted by the luminescent material layer is red, diameters of the quantum dots are greater than or equal to 4 nm;

when the light emitted by the luminescent material layer is blue, diameters of the quantum dots are less than or equal to 2 nm; and when the light emitted by the luminescent material layer is green, diameters of the quantum dots are greater than or equal to 2.5 nm and less than or equal to 3.5 nm.

According to one aspect of the present application, the quantum dot material layer includes a high molecular polymer and quantum dots uniformly distributed in the high molecular polymer, wherein the quantum dots include a combination of one or more of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and indium arsenide quantum dots.

Beneficial Effect

The anode and the cathode of the display panel of the present application are indium tin oxide and are configured to match the work function of the luminescent material in the luminescent material layer to improve luminous efficiency of the display panel. Meanwhile, in order to improve the utilization of light, the present application provides the cathode reflective layer and the quantum dot film over the cathode of the light-emitting structure. The present application proposes the bottom-emission OLED display panel provided with the quantum dot film, which effectively prevents pixel dot failure caused by oxidation of a reflective material in the conventional art. On the other hand, the present application places the quantum dot film between the cathode and the cathode reflective layer, and optimizes reflected light by using the quantum dot film, compared to the conventional art in which the quantum dot film is disposed on the light-emitting surface of the display panel. The process complexity of the present application is lower and is convenient for mass production.

DETAILED DESCRIPTION OF EMBODIMENTS

Figure 1:
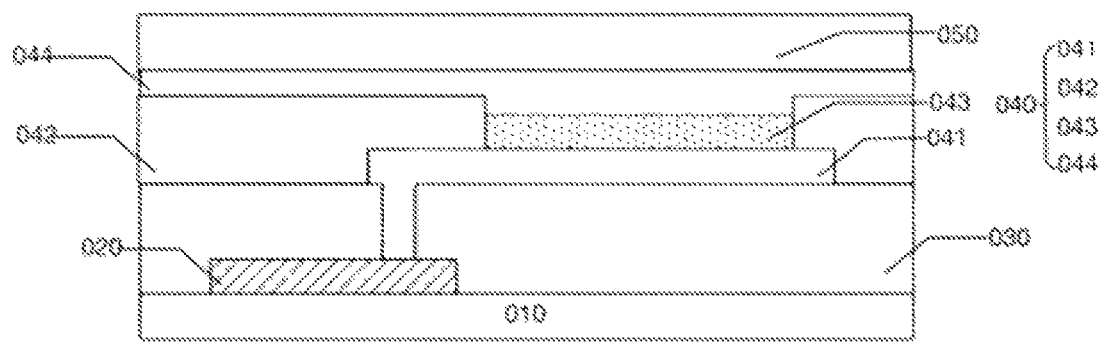
FIG. 1 is a schematic structural view of a display panel in the conventional art.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

Referring to FIG. 1, FIG. 1 is a schematic structural view of a display panel in the conventional art, wherein the display panel is a top-emission display panel, that is, a light-emitting surface of the display panel is a surface of a cathode of a light-emitting structure away from an anode.

Referring to FIG. 1, a top-emission organic light-emitting diode (OLED) display panel of the conventional art includes a substrate 010, a thin film transistor 020, a planarization layer 030, a light-emitting structure 040, and a cover 050. The light-emitting structure 040 is positioned above the planarization layer and includes an anode 041, a pixel definition layer 042, a luminescent material layer 043, and a cathode 044. The anode 041 is positioned on the planarization layer 030 and is electrically connected to the thin film transistor 020 through a via hole. The pixel definition layer 042 covers the planarization layer 030 and has an opening exposing the anode 041. The luminescent material layer 043 is positioned in the opening, and the cathode 044 covers the luminescent material layer 043.

Since the surface of the cathode away from the anode is the light-emitting surface, the cathode is a transparent electrode. At the same time, in order to improve light utilization, the anode is a reflective electrode. In the conventional art, in order to match energy levels of the anode and an organic luminescent material layer, a material in which the anode is in direct contact with the organic luminescent material is indium tin oxide (ITO). At the same time, since the anode needs to be used as a reflective electrode, the anode also needs to be provided with a metal having high reflectivity for reflection, and the metal generally used as a reflective material is silver (Ag).

In addition, in order to improve the display effect of the OLED display panels, a quantum dot film is usually added to the display panel. The quantum dot film has photoluminescence characteristics, and the light emitted from the quantum dot film has high color purity and small color shift, and can effectively improve the luminous performance of the OLED display panels. Limited by the fabrication process, typically, the quantum dot film is disposed between the light-emitting structure 040 and the cover 050.

There are two problems with the conventional top-emission OLED display panels. First, the Ag of the anode is easily oxidized in the air to form oxidized silver bumps. The silver bumps cause the anode and the cathode of the OLED device to short-circuit, so that the pixel dots cannot emit light, which affects the display quality. Second, a film thickness of the top-emission OLED display panel is difficult to adjust, the cathode voltage drop is serious, and the fabrication process is relatively complicated.

Figure 2:
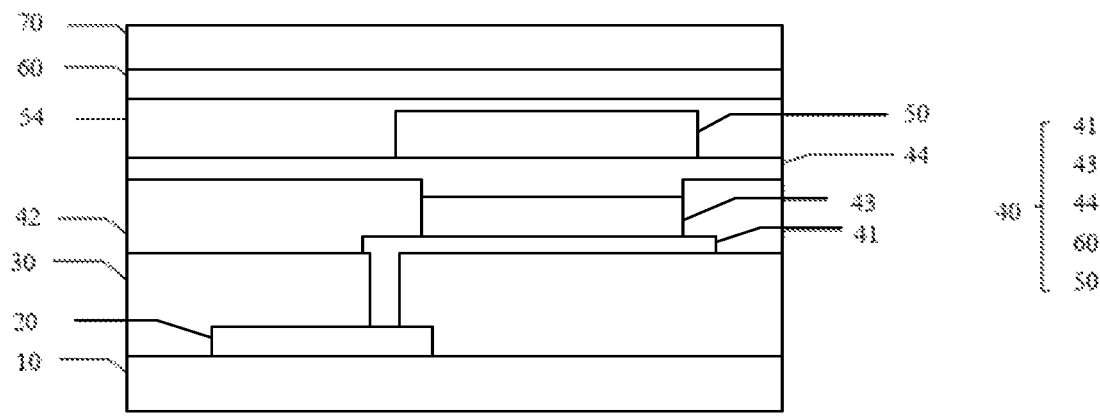
FIG. 2 is a schematic structural view of a display panel according to an embodiment of the present application.

In order to solve the above problems, the present application provides a display panel. Referring to FIG. 2, the display panel includes a substrate 10, a thin film transistor layer 20, a light-emitting structure 40, and a cover plate 70. The light-emitting structure 40 includes an anode 41, a pixel definition layer 42, a luminescent material layer 43, a cathode 44, a quantum dot film 50, and a cathode reflective layer 60.

The anode 41 is electrically connected to the thin film transistor 20 through a via hole. The pixel definition layer 42 covers the planarization layer 30 and has an opening exposing the anode 41. The luminescent material layer 43 is positioned in the opening, and the cathode 44 covers the luminescent material layer 43.

In the present application, the anode 41 and the cathode 44 are both light-transmitting electrodes. Materials used for forming the anode 41 and the cathode 44 are transparent conductive materials such as a combination of one or more of indium tin oxide, aluminum-doped zinc oxide, and fluorine-doped tin oxide. The present application uses a transparent material to form the anode 41 to instead of the reflective metal in the anode 41. The transparent conductive material not only more closely matches the work function of the luminescent material, but also prevents the metal from being oxidized to generate bumps that cause the anode 41 and the cathode 44 to short-circuit, thereby improving the quality of the display panels.

Since the reflective metal is removed from the cathode 44, the present application provides the cathode reflective layer 60 in the light-emitting structure 40 in order to not reduce the light utilization of the light-emitting structure 40. In the present application, a material used for forming the cathode reflective layer 60 is a metal having high reflectivity, such as a combination of one or more of silver, copper, aluminum, gold, and iron. In this embodiment, the material used for forming the cathode reflective layer 60 is silver. Preferably, in order to enhance ability of the cathode reflective layer to reflect light, a surface of the cathode reflective layer is a smooth mirror structure. The mirror structure minimizes the light loss caused by diffuse reflection and further improves the light utilization of the light-emitting structure. In practice, since a surface of the metal layer formed by electroplating is a mirror structure, the cathode reflection layer 60 is preferably formed by electroplating.

The cathode reflective layer 60 is positioned between the cathode 44 and the cover plate 70, and is electrically insulated from the cathode 44 by a reflective isolation layer 54. A material used for forming the reflective isolation layer 54 is an insulating material such as silicon nitride, silicon oxide, or the like. The reflective isolation layer 54 covers the cathode reflective layer 60 to achieve electrical insulation between the cathode 44 and the cathode reflective layer 60.

In the present application, referring to FIG. 2, in order to further improve the utilization of reflected light, the display panel further includes a quantum dot film 50 disposed between the cathode 44 and the cathode reflective layer 60.

In this embodiment, in order to save cost, the quantum dot film 50 is disposed corresponding to the luminescent material layer 43. Specifically, the reflective isolation layer 54 has a positioned through hole positioned directly above the luminescent material layer 43, and the quantum dot film 50 fills the positioned through hole.

In the present application, the cathode reflective layer 60 and the quantum dot film 50 are disposed corresponding to the luminescent material layer 43. Specifically, the cathode reflective layer 60 and the quantum dot film 50 are positioned directly above the luminescent material layer 43. At the same time, in order to ensure that the cathode reflective layer can reflect all the light emitted from the light-emitting structure 40 back to a light-emitting surface, areas of the cathode reflective layer 60 and the quantum dot film 50 are greater than an area of the luminescent material layer 43. In this embodiment, projections of the cathode reflective layer 60 and the quantum dot film 50 on the light-emitting surface of the display panel completely covers a projection of the luminescent material layer 43 on the light-emitting surface of the display panel.

As can be seen from the above embodiments, the present application sets the cathode and the anode in the top-emission OLED display panels of the conventional art as transparent electrodes to make the electrodes more closely match the luminescent material. At the same time, the present application provides the cathode reflective layer between the cathode and the cover plate, and the top-emission OLED display panel is modified into a bottom-emission OLED display panel, which is beneficial to reducing pressure drops of the display panel and simplifying the fabrication process. In addition, the present application provides the quantum dot film between the cathode and the cathode reflective layer, which effectively improves the luminescent performance of the OLED display panel without increasing the complexity of the fabrication process.

Figure 3:
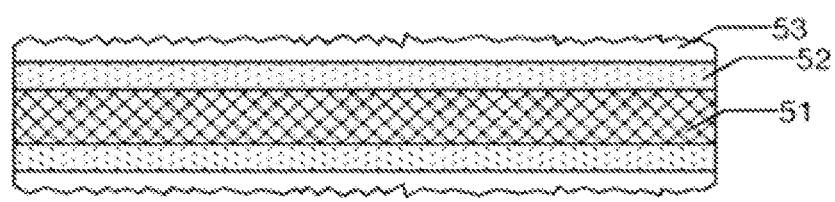
FIG. 3 is a schematic structural view of a quantum dot film in the display panel of FIG. 2.

Referring to FIG. 3, in this embodiment, the quantum dot film 50 includes a quantum dot material layer 51, a barrier layer 52, and a protective layer 53.

On the one hand, the quantum dot material layer 51 can enhance the light emitted from the luminescent material layer 43 toward the cathode reflective layer 60, and can enhance the light reflected by the cathode reflective layer 60 toward the light-emitting surface. Therefore, the light that is emitted from the luminescent material layer toward an inside of the display panel is further forced to be emitted twice from the light-emitting surface of the display panel. Compared with the conventional art, the present application further improves luminous efficiency of the light-emitting structure 40, and optimizes display effect of the display panel.

In this embodiment, the quantum dot material layer 51 includes a high molecular polymer and quantum dots uniformly distributed in the high molecular polymer. The quantum dots include a combination of one or more of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and indium arsenide quantum dots.

The barrier layer 52 is attached to both surfaces of the quantum dot material layer 51 that are parallel to the light-emitting surface of the display panel. In this embodiment, the barrier layer 52 is an inorganic protective film that blocks water and oxygen intrusion, such as a silicon dioxide film.

The protective layer 53 is attached to a surface of the barrier layer 52 away from the quantum dot material layer 51. The protective layer 53 is preferably an acrylic material having a high light-transmittance or a polyethylene terephthalate (PET).

Referring to FIG. 3, in this embodiment, a surface of the protective layer 53 away from the surface of the quantum dot material layer 51 has an optical micro/nano structure. The optical micro/nano structure is a plurality of irregular protrusions and recessions, and heights of the plurality of protrusions and recessions do not exceed 10 micrometers. The optical micro/nano structure can reduce the Newton's ring, balance the intensity and brightness of the light, and at the same time increase path of the light return, which is beneficial to the enhancement of the light.

In the present application, sizes of quantum dots in the quantum dot film 50 correspond to a color of the light emitted from the luminescent material layer 43. When the light emitted by the luminescent material layer 43 is red, diameters of the quantum dots are greater than or equal to 4 nm. When the light emitted by the luminescent material layer 43 is blue, diameters of the quantum dots are less than or equal to 2 nm. When the light emitted by the luminescent material layer 43 is green, diameters of the quantum dots are greater than or equal to 2.5 nm and less than or equal to 3.5 nm.

Compared with the top-emission OLED display panel in the conventional art, the present application effectively prevents pixel point failure due to oxidation of the reflective material. Meanwhile, the present application places the quantum dot film between the cathode and the cathode reflective layer, and optimizes the reflected light by using the quantum dot film. Compared with the conventional art in which the quantum dot film is disposed on the light-emitting surface of the display panel, the process complexity of the present application is lower and is convenient for mass production.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising a substrate, a thin film transistor layer, and a light-emitting structure, the light-emitting structure comprising:
    an anode positioned on the thin film transistor layer, and electrically connected to the thin film transistor layer;
    a luminescent material layer positioned on the anode; and
    a cathode covering the luminescent material layer;
    wherein the light-emitting structure further comprises a cathode reflective layer and a quantum dot film, the cathode reflective layer is positioned above the cathode and electrically insulated from the cathode by a reflective isolation layer, and the quantum dot film is positioned in the reflective isolation layer that is between the cathode and the cathode reflective layer.

2. The display panel according to claim 1, wherein materials of the anode and the cathode are selected from a combination of one or more of indium tin oxide, aluminum-doped zinc oxide, and fluorine-doped tin oxide.

3. The display panel according to claim 2, wherein a material of the cathode reflective layer is selected from a combination of one or more of silver, copper, aluminum, gold, and iron.

4. The display panel according to claim 3, wherein a surface of the cathode reflective layer is a smooth mirror structure.

5. The display panel according to claim 1, wherein the cathode reflective layer is disposed corresponding to the luminescent material layer, and a projection of the cathode reflective layer on a light-emitting surface of the display panel is greater than a projection of the luminescent material layer on the light-emitting surface of the display panel.

6. The display panel according to claim 5, wherein the reflective isolation layer comprises a positioned through hole, and the quantum dot film is positioned in the positioned through hole.

7. The display panel according to claim 5, wherein a positioned through hole is disposed corresponding to the luminescent material layer, and a projection of the positioned through hole on the light-emitting surface of the display panel is greater than the projection of the luminescent material layer on the light-emitting surface of the display panel.

8. The display panel according to claim 7, wherein the quantum dot film comprises:
   a quantum dot material layer;
   a barrier layer attached to two surfaces of the quantum dot material layer parallel to the light-emitting surface of the display panel; and
   a protective layer attached to a surface of the barrier layer away from the quantum dot material layer.

9. The display panel according to claim 8, wherein a surface of the protective layer away from the quantum dot material layer consists of an optical micro/nano structure.

10. The display panel according to claim 8, wherein sizes of quantum dots in the quantum dot film correspond to a color of light emitted from the luminescent material layer;
    wherein when the light emitted by the luminescent material layer is red, diameters of the quantum dots are greater than or equal to 4 nm;
    when the light emitted by the luminescent material layer is blue, the diameters of the quantum dots are less than or equal to 2 nm; and
    when the light emitted by the luminescent material layer is green, the diameters of the quantum dots are greater than or equal to 2.5 nm and less than or equal to 3.5 nm.

11. The display panel according to claim 8, wherein the quantum dot material layer comprises a high molecular polymer and quantum dots uniformly distributed in the high molecular polymer, wherein the quantum dots comprise a combination of one or more of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and indium arsenide quantum dots.

* * * * *